United States Patent [19]
Yu

[11] Patent Number: 6,163,188
[45] Date of Patent: Dec. 19, 2000

[54] INPUT BUFFER AND INPUT-OUTPUT BUFFER IN FULL COMPLIANCE WITH IDDQ TESTABILITY

[75] Inventor: Shih-Ming Yu, Hsinchu Hsien, Taiwan

[73] Assignee: Faraday Technology Corp., Hsinchu, Taiwan

[21] Appl. No.: 09/178,242

[22] Filed: Oct. 23, 1998

[30] Foreign Application Priority Data

Jul. 4, 1998 [TW] Taiwan ................................. 87110828

[51] Int. Cl.[7] ..................................................... H03K 3/02
[52] U.S. Cl. ........................ 327/199; 327/200; 327/208; 327/211; 327/212
[58] Field of Search .................................... 327/199, 200, 327/201, 202, 203, 208, 209, 210, 211, 212, 218

[56] References Cited

U.S. PATENT DOCUMENTS

| | | | |
|---|---|---|---|
| 4,223,524 | 9/1980 | Nakagawa ................................. | 331/176 |
| 4,704,587 | 11/1987 | Ouyang et al. ........................... | 331/158 |
| 5,225,724 | 7/1993 | Scarra' et al. .............................. | 326/16 |
| 5,440,263 | 8/1995 | Fournel et al. .......................... | 327/546 |
| 5,602,495 | 2/1997 | Lou ............................................ | 326/71 |
| 5,786,734 | 6/1998 | Park .......................................... | 331/57 |

Primary Examiner—Timothy P. Callahan
Assistant Examiner—An T. Luu
Attorney, Agent, or Firm—J.C. Patents; Jiawei Huang

[57] ABSTRACT

An input buffer and an input-output buffer in full compliance with IDDQ testability are provided, which use a signal fed back to a P-type or N-type controllable switch to turn on or turn off the switch so as to obtain a desired resistance by using an equivalent circuit for the buffer. The problem of reduced operating speed due to the use of a high-impedance resistor is then avoided. Hence, the IDDQ testing results will not be affected by using the input buffer or the input-output buffer, no matter the circuit is operated in an output mode or input mode. Furthermore, the input signal, either in the low state or in the high state, has no effect on the IDDQ testing results either.

8 Claims, 3 Drawing Sheets

INPUT BUFFER AND INPUT-OUTPUT BUFFER IN FULL COMPLIANCE WITH IDDQ TESTABILITY

CROSS-REFERENCE TO RELATED APPLICATION

This application claims the priority benefit of Taiwan application serial no. 87110828, filed Jul. 4, 1998, the full disclosure of which is incorporated herein by reference.

BACKGROUND OF THE INVENTION

1. Field of Invention

The present invention generally relates to buffers, and more particularly to input buffers and input-output buffers, which are in full compliance with IDDQ testability.

2. Description of Related Art

Integrated circuits (IC) are now used everywhere in the world. There is no exaggeration to say that ICs are indispensable to the day-to-day life of human being. However, fabrication processes of ICs are very complicated. There are hundreds of steps involved, and a time frame of one or two months is required to make an IC. Basically, the IC industry includes four branches, namely, IC design, wafer fabrication, testing, and packaging, which are combined together to build this high-technology industry. It is therefore not only an industry of advanced technology, but also an industry of high risk, which requires tremendous capital to support its continuous development.

In order to distinguish good semiconductor components, for example, ICs, from bad ones, various tests are required after all the fabrication processes are completed. Quiescent-current testing, or IDDQ for abbreviation, is one of the tests, which is widely used to determine if there exist any short or bridge errors in semiconductor components. If the errors are found in a component under an IDDQ testing, appropriate measurements need to be taken, such as selling it in lower prices, or even discarding it totally.

When ICs are tested and packaged, they can then be applied to practical circuits. Conventionally, external resistors are added to input-output (I/O) pins in many applied circuits, so as to provide a stable certain default input-output state and reduce interference from noises. The external resistors, however, take extra space and increase production cost, which is not economical.

To solve the space-taking problem, resistors are accordingly constructed within the integrated circuits to avoid the cost problem. It is worth noting that the resistors chosen have a significant impact on the biased current of the IC. For example, assume a resistor connected to an input-output line, which has a resistance value ranged between 10KΩ to 50KΩ. If a 50-KΩ resistor is used, the biased current is about 5V/50KΩ=0.1 mA when the voltage across the resistor is 5V. However, resistance variation for a resistor in the fabrication process is about ±60%. If there are ten input-output lines, the variation range of the produced biased current is about 1 mA±60%=600 μA.

In another aspect, the fault conducting current obtained due to a short or bridge circuit in an IC under testing is ranged between 10 μA to 100 μA. That is, when a current measured in an IDDQ testing is larger than 10μA, errors have occurred in the IC under testing.

Therefore, the biased current with a variation range of 600 μA will result in a failure to distinguish whether the problem is resulted from the short or bridge circuit of an IC or from the variation range of the 600 μA biased current during an IDDQ testing. It is impossible to have accurate testing results under this circumstance. To solve this problem, the resistor needs to be replaced by a high-impedance one. For example, the 50-KΩ resistor is replaced by a 5-MΩ resistor. Another problem arises, however, since the high-impedance resistors used within ICs are susceptible to interference during operations, causing instability problem or even failure. Furthermore, the operating speed is also reduced because of the high-impedance resistors.

Conventionally, pullup or pulldown resistors in an input buffer need to be smaller than 100KΩ so as to meet the speed requirements. It is then impossible to perform the IDDQ testing because the variation of the biased current due to the resistor is far larger than that of the fault conducting current. Therefore, it is necessary to use a high-state input voltage for the input buffer if a pullup resistor coupled to a voltage source is used, and a low-state input voltage for the input buffer if a pulldown resistor coupled to a ground is used, so that the IDDQ testing can be performed because there is no voltage drop across the resistor to produce the undesired biased current. Unfortunately, these conditions are too strict to generally apply to all applications, resulting in failure in performing the IDDQ testing for some applications.

SUMMARY OF THE INVENTION

It is therefore an objective of the present invention to provide an input buffer and an input-output buffer in full compliance with IDDQ testability to solve the problems of performing the IDDQ testing for some applications It is another objective of the present invention to provide an input buffer and an input-output buffer in full compliance with IDDQ testability, which solve the problem of low operating speed due to the use of a high-impedance resistor.

In accordance with the foregoing and other objectives of the present invention, an input buffer and an input-output buffer in full compliance with IDDQ testability are provided, which use a signal fed back to a P-type or N-type controllable switch to turn on or turn off the switch so as to obtain a desired resistance by using an equivalent circuit for the buffer. The problem of reduced operating speed due to the use of a high-impedance resistor is then avoided. Hence, the IDDQ testing results will not be affected by using the input buffer or the input-output buffer, no matter the circuit is operated in an output mode or input mode. Furthermore, the input signal, either in the low state or in the high state, has no effect on the IDDQ testing results either.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
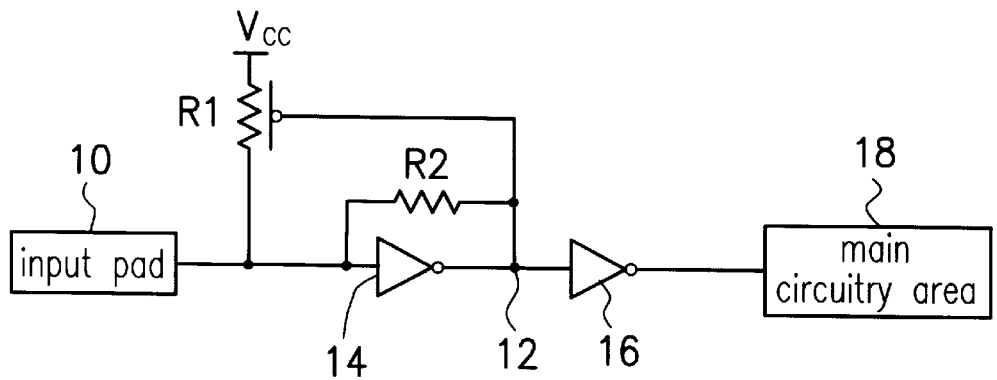
FIGS. 1A to 1D show circuit diagrams of input buffers in full compliance with IDDQ testability according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIGS. 1A to 1D, which show the circuit diagrams of the input buffers in full compliance with IDDQ testability according to the first embodiment of the present invention. As shown in the figures, R1 is a resistor of a controllable switch made from, for example, N-type or P-type transistors. The controllable switch has a control input, which determines the on/off state of the switch depending on the signal received. The P-type controllable switch is off when the control input is in the high state, and is on when the control input is in the low state. The N-type controllable switch, on the other hand, turns on when the control input is in the high state, and turns off when the control input is in the low state. R2 is a resistor of high impedance, for example, 1MΩ, provided that R2 is 10 to 100 times larger than R1 so as to have no effect in measuring the IDDQ current. Also shown in the figures, Vcc stands for an internal voltage source within the integrated circuit. An input voltage to the input pad is provided by, for example, a power supply (not shown).

Refer to FIG. 1A, which shows a circuitry 100 to solve the conventional problem of performing the IDDQ testing for some applications.

Consider the circuitry 100 during an IDDQ testing. When the input voltage of input pad 10 is in the low state, node 12 becomes the high state, for example, Vcc or +5V, because of the action of inverter 14. R2 at this time is equivalently connected to a voltage source, serving as a pullup resistor. Also, the high potential of node 12 turns off the P-type controllable switch. Therefore, the circuitry is equivalent to a high-impedance resistor R2 pulling up to a voltage source. The IDDQ testing can still be performed in the main circuitry area 18 without causing the conventional problems of inaccurate measurements.

During a normal operation, when the input voltage reaches the threshold voltage of the inverter 14 from the low state, node 12 becomes the low state, which will turn on the controllable switch. When the controllable switch is on, the potential of the input pad 10 quickly goes to the high state. That is, R1 with a low resistance value of the controllable switch equivalently acts as a pullup resistor. If there is a noise entering into the circuit at this time, the controllable switch will be easier to turn on because the voltage variation of the noise makes the high state easily latched. Therefore, the conventional problems of reduced operating speed due to high impedance, as well as instability or usage failure due to interference are avoided. Consequently, the input signal from the input pad 10 proceeds to operate in the main circuitry area 18 after the action of inverter 16.

As a summary, during an IDDQ testing, input voltage in the low state turns off the controllable switch, while R2 appears as a high-impedance resistor having no effect on the IDDQ testing results. In another aspect, during a normal operation, when the input signal reaches the threshold voltage of the inverter 14, node 12 becomes the low state turning on the controllable switch. At this time, R1 with a smaller resistance value of the controllable switch replaces R2 as the pullup resistor, so that the problem of reduced operating speed is avoided.

Figure 1B:
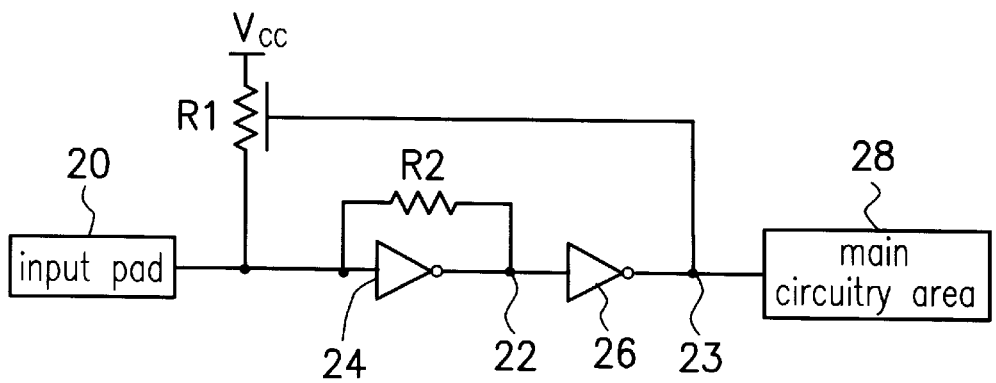

Refer to FIG. 1B, which is very similar to FIG. 1A in circuitry structure. The only difference is that FIG. 1B employs a resistor R1 of a N-type controllable switch.

During an IDDQ testing, when the input voltage of input pad 20 in circuitry 200 is in the low state, node 22 becomes the high state, because of the action of inverter 24. Consequently, node 23 becomes the low state because of the action of inverter 26 so as to turn off the controllable switch. Therefore, the circuitry is equivalent to a high-impedance resistor R2 pulling up to a voltage source. The IDDQ testing can still be performed in the main circuitry area 28 without causing the conventional problems of inaccurate measurements.

During a normal operation, when the input voltage reaches the threshold voltage of the inverter 24 from the low state, node 22 becomes the low state and node 23 becomes the high state, which will turn on the controllable switch. When the controllable switch is on, the potential of the input pad 20 quickly goes to the high state. That is, R1 with a low resistance value of the controllable switch equivalently acts as a pullup resistor. If there is a noise entering into the circuit at this time, the controllable switch will be easier to turn on because the voltage variation of the noise makes the high state easily latched. Therefore, the conventional problems of reduced operating speed due to high impedance, as well as instability or usage failure due to interference are avoided. Consequently, the input signal from the input pad 20 proceeds to operate in the main circuitry area 28 after the action of the inverter 26.

As a summary, during an IDDQ testing, input voltage in the low state turns off the controllable switch, while R2 appears as a high-impedance resistor having no effect on the IDDQ testing results. In another aspect, during a normal operation, when the input signal reaches the threshold voltage of the inverter 24, node 23 becomes the high state turning on the controllable switch. At this time, R1 with a smaller resistance value of the controllable switch replaces R2 as the pullup resistor, so that the problem of reduced operating speed is avoided.

Figure 1C:
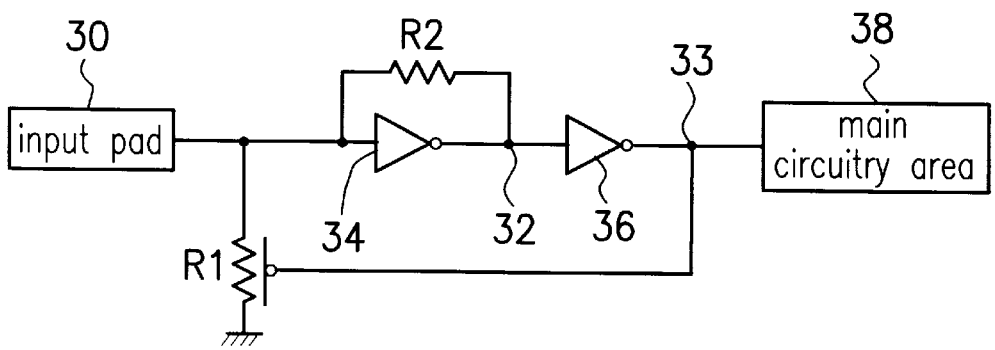

Refer to FIG. 1C, which shows a circuitry 300 of an input buffer. During an IDDQ testing, when the input voltage of input pad 30 is in the high state, node 32 becomes the low state, for example, a ground potential, because of the action of inverter 34. R2 at this time is equivalently grounded, serving as a pulldown resistor. Consequently, node 33 becomes the high state because of the action of inverter 36. Also, the high potential of node 33 turns off the controllable switch. Therefore, the circuitry is equivalent to a high-impedance resistor R2 pulling down to the ground. The IDDQ testing can still be performed in the main circuitry area 38 without causing the conventional problems of inaccurate measurements.

During a normal operation, when the input voltage falls below the threshold voltage of the inverter 34 from the high state, node 32 becomes the high state and node 33 becomes the low state, which will turn on the controllable switch. When the controllable switch is on, the potential of the input pad 30 quickly goes to the ground level. That is, R1 with a low resistance value of the controllable switch equivalently acts as a pulldown resistor. If there is a noise entering into the circuit at this time, the controllable switch will be easier to turn on because the voltage variation of the noise makes the low state easily latched. Therefore, the conventional problems of reduced operating speed due to high impedance, as well as instability or usage failure due to interference are avoided. Consequently, the input signal from the input pad 30 proceeds to operate in the main circuitry area 38 after the action of the inverter 36.

As a summary, during an IDDQ testing, input voltage in the high state turns off the controllable switch, while R2 appears as a high-impedance resistor having no effect on the IDDQ testing results. In another aspect, during a normal operation, when the input signal falls below the threshold voltage of the inverter 34, node 33 becomes the low state turning on the controllable switch. At this time, R1 with a smaller resistance value of the controllable switch replaces R2 as the pulldown resistor, so that the problem of reduced operating speed is avoided.

Figure 1D:
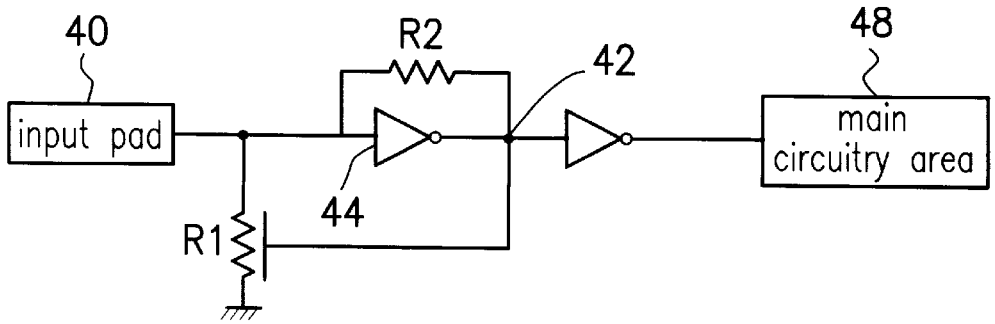

Refer to FIG. 1D, which is very similar to FIG. 1C in circuitry structure. The only difference is that FIG. 1D employs a resistor R1 of a N-type controllable switch.

During an IDDQ testing, when the input voltage of input pad 40 in circuitry 400 is in the high state, node 42 becomes the low state, because of the action of inverter 44. R2 at this time is equivalently grounded, serving as a pulldown resistor. Also, the low potential of node 42 turns off the controllable switch. Therefore, the circuitry is equivalent to a high-impedance resistor R2 pulling down to the ground. The IDDQ testing can still be performed in the main circuitry area 48 without causing the conventional problems of inaccurate measurements.

During a normal operation, when the input voltage falls below the threshold voltage of the inverter 44 from the high state, node 42 becomes the high state, which will turn on the controllable switch. When the controllable switch is on, the potential of the input pad 40 quickly reduces to the ground level. That is, R1 with a low resistance value of the controllable switch equivalently acts as a pulldown resistor. If there is a noise entering into the circuit at this time, the controllable switch will be easier to turn on because the voltage variation of the noise makes the low state easily latched. Therefore, the conventional problems of reduced operating speed due to high impedance, as well as instability or usage failure due to interference are avoided. Consequently, the input signal from the input pad 40 proceeds to operate in the main circuitry area 48 after the action of the inverter 42.

As a summary, during an IDDQ testing, input voltage in the high state turns off the controllable switch, while R2 appears as a high-impedance resistor having no effect on the IDDQ testing results. In another aspect, during a normal operation, when the input signal falls below the threshold voltage of the inverter 44, node 42 becomes the high state turning on the controllable switch. At this time, R1 with a smaller resistance value of the controllable switch replaces R2 as the pulldown resistor, so that the problem of reduced operating speed is avoided.

Hence, the input buffer according to the first preferred embodiment of the present invention requires that R2 is far larger than R1, for example, R2 is 10 to 100 times larger than R1, so that R2 has no effect in measuring the IDDQ current, no matter the input signal is in the low or high state. For example, if R1 has an equivalent resistance less than 100KΩ, the resistance value of R2 is then required to be larger than 1MΩ accordingly.

Refer to FIGS. 2A to 2D, which show the circuit diagrams of the input-output buffers in full compliance with IDDQ testability according to the second embodiment of the present invention. As shown in the figures, R1 is a resistor of a controllable switch made from, for example, N-type or P-type transistors. The controllable switch has a control input, which determines the on or off state of the switch depending on the signal received. The P-type controllable switch is off when the control input is in the high state, and is on when the control input is in the low state. The N-type controllable switch, on the other hand, turns on when the control input is in the high state, and turns off when the control input is in the low state. R2 is a resistor of high impedance, for example, 1MΩ, provided that R2 is 10 to 100 times larger than R1 so as to have no effect in measuring the IDDQ current. As shown in the figures, Vcc stands for an internal voltage source within the integrated circuits. An input voltage to the input-output pad is provided by, for example, a power supply (not shown).

Figure 2A:
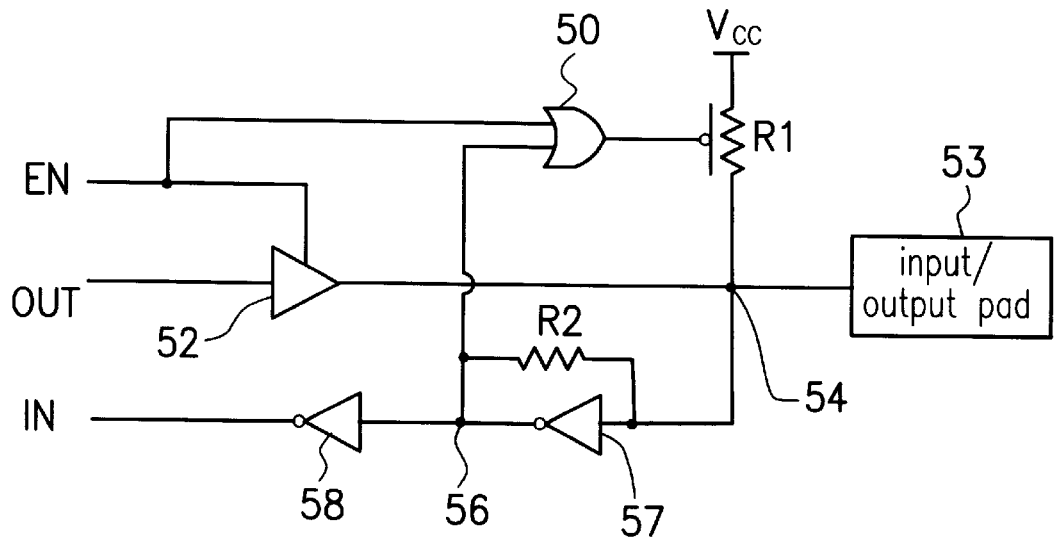
FIG. 2A to 2D show circuit diagrams of input buffers and input-output buffers in full compliance with IDDQ testability according to a second embodiment of the present invention.

Refer to FIG. 2A, which shows a circuitry 500 of the input-output buffer. When the circuitry 500 is used in the output mode, the output enabler EN is high, so that the output from OR gate 50 is also high. Therefore, the P-type controllable switch is turned off. In addition, the output enabler EN also turns on tristate buffer 52, so that the output signal is transmitted to input-output pad 53.

When the circuitry 500 is used in the input mode, the output enabler EN is low. When the input voltage of the input-output pad 53 is in the low state, i.e. node 54 is in the low state, node 56 will be in the high state, because of the action of inverter 57. R2 at this time is equivalently connected to a voltage source, serving as a pullup resistor. Also, the output from the OR gate 50 is high, which turns off the controllable switch. Therefore, the circuitry is equivalent to a high-impedance resistor R2 pulling up to a voltage source. The IDDQ testing can still be performed in the main circuitry area (not shown) without causing the conventional problems of inaccurate measurements.

During a normal operation, when the input voltage reaches the threshold voltage of the inverter 57 from the low state, node 56 becomes the low state and the output from the OR gate 50 is low, which will turn on the controllable switch. When the controllable switch is on, the potential of the input-output pad 53 quickly goes to the high state. That is, R1 with a low resistance value of the controllable switch equivalently acts as a pullup resistor. Consequently, the input signal from the input-output pad 53 proceeds to operate in the main circuitry area (not shown) after the action of inverter 58.

As a summary, during an IDDQ testing, input voltage in the low state and output enabler EN in the low state turn off the controllable switch, while R2 appears as a high-impedance resistor having no effect on the IDDQ testing results. In another aspect, during a normal operation, when the input signal reaches the threshold voltage of the inverter 57, node 56 becomes the low state turning on the controllable switch. At this time, R1 with a smaller resistance value of the controllable switch replaces R2 as the pullup resistor, so that the problem of reduced operating speed is avoided. Furthermore, the interference from a noise can be avoided with the use of the pullup resistor R1.

Figure 2B:
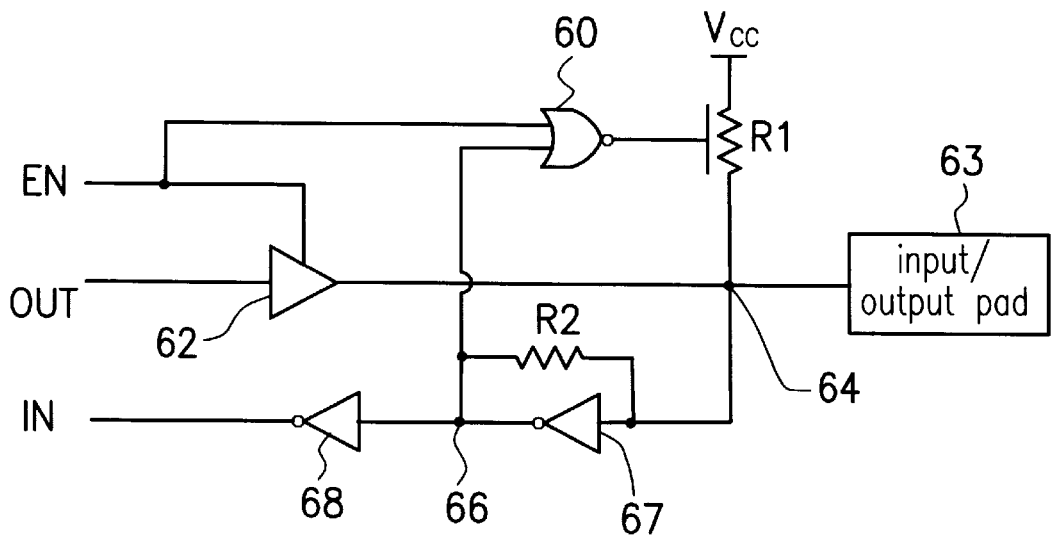

Refer to FIG. 2B, which is very similar to FIG. 2A in circuitry structure. Similarly, when circuitry 600 is used in the output mode, the output enabler EN is high, so that the output from NOR gate 60 is low. Therefore, the N-type controllable switch is turned off. In addition, the output enabler EN also turns on tristate buffer 62, so that the output signal is transmitted to input-output pad 63.

When the circuitry 600 is used in the input mode, the output enabler EN is low. When the input voltage of the input-output pad 63 is in the low state, i.e. node 64 is in the low state, node 66 will be in the high state, because of the action of inverter 67. R2 at this time is equivalently connected to a voltage source, serving as a pullup resistor. Also, output from the NOR gate 60 is low, which turns off the controllable switch. Therefore, the circuitry is equivalent to a high-impedance resistor R2 pulling up to a voltage source.

The IDDQ testing can still be performed in the main circuitry area (not shown) without causing the conventional problems of inaccurate measurements.

During a normal operation, when the input voltage reaches the threshold voltage of the inverter 67 from the low state, node 66 becomes the low state and the output from the NOR gate 60 is high, which will turn on the controllable switch. When the controllable switch is on, the potential of the input-output pad 63 quickly goes to the high state. That is, R1 with a low resistance value of the controllable switch equivalently acts as a pullup resistor. Consequently, the input signal from the input-output pad 63 proceeds to operate in the main circuitry area after the action of inverter 68.

Figure 2C:
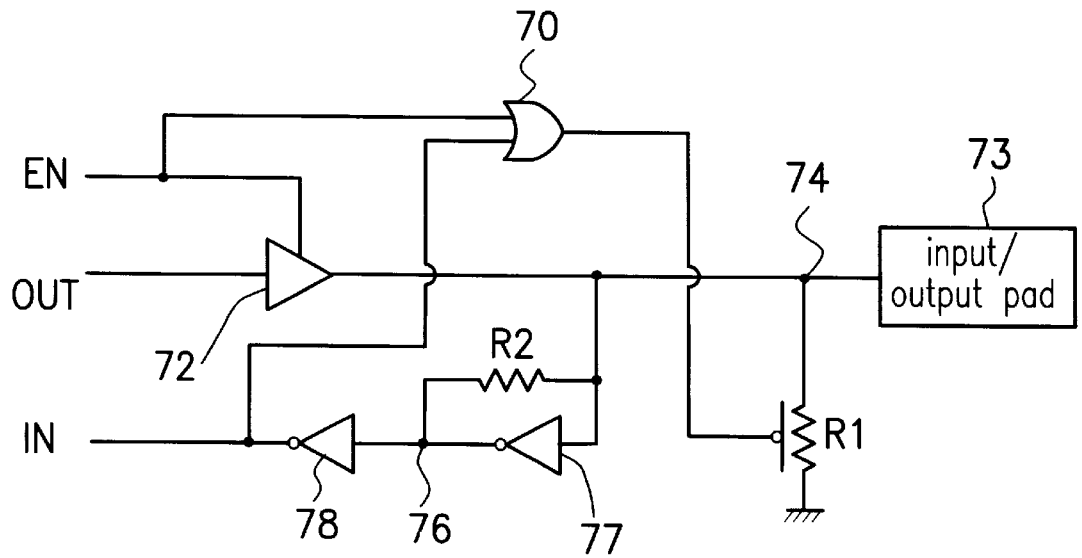

Refer to FIG. 2C which shows a circuitry 700 of the input-output buffer. When the circuitry 700 is used in the output mode, the output enabler EN is high, so that the output from OR gate 70 is also high. Therefore, the P-type controllable switch is turned off. In addition, the output enabler EN also turns on tristate buffer 72, so that the output signal is transmitted to input-output pad 73.

When the circuitry 700 is used in the input mode, the output enabler EN is low. When the input voltage of the input-output pad 73 is in the high state, i.e. node 74 is in the high state, node 76 will be in the low state, because of the action of inverter 77. R2 at this time is equivalently grounded, serving as a pulldown resistor. Also, the output from inverter 78 is high, and the output from the OR gate 50 is high so as to turn off the controllable switch. Therefore, the circuitry is equivalent to a high-impedance resistor R2 pulling down to the ground. The IDDQ testing can still be performed in the main circuitry area (not shown) without causing the conventional problems of inaccurate measurements.

During a normal operation, when the input voltage falls below the threshold voltage of the inverter 77 from the high state, node 76 becomes the high state and the output from the inverter 78 is low. Thus, the output from the OR gate 70 is low, which will turn on the controllable switch. When the controllable switch is on, the potential of the input-output pad 73 quickly drops to the low state. That is, R1 with a low resistance value of the controllable switch equivalently acts as a pulldown resistor. Consequently, the input signal from the input-output pad 73 proceeds to operate in the main circuitry area after the action of the inverter 78.

Figure 2D:
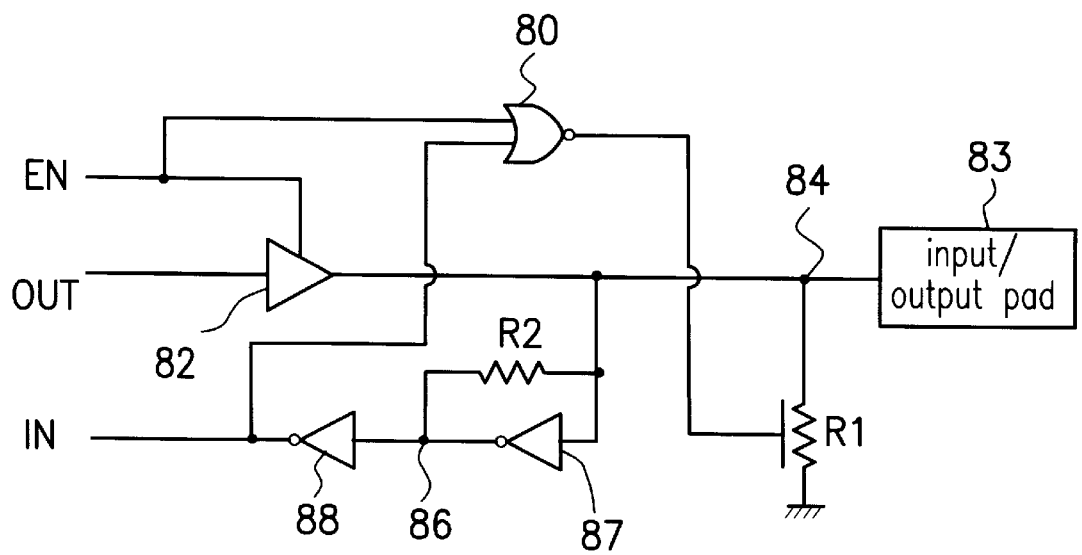

Refer to FIG. 2D, which is very similar to FIG. 2C in circuitry structure. Similarly, when the circuitry 800 is used in the output mode, the output enabler EN is high, so that output from NOR gate 80 is also low. Therefore, the N-type controllable switch is turned off. In addition, the output enabler EN also turns on tristate buffer 82, so that the output signal is transmitted to input-output pad 83.

When the circuitry 800 is used in the input mode, the output enabler EN is low. When the input voltage of the input-output pad 83 is in the high state, i.e. node 84 is in the high state, node 86 will be in the low state, because of the action of inverter 87. R2 at this time is equivalently grounded, serving as a pulldown resistor. Also, the output from inverter 88 is high so that the output from the NOR gate 80 is low, which turns off the controllable switch. Therefore, the circuitry is equivalent to a high-impedance resistor R2 pulling down to the ground. The IDDQ testing can still be performed in the main circuitry area (not shown) without causing the conventional problems of inaccurate measurements.

During a normal operation, when the input voltage falls below the threshold voltage of the inverter 87 from the high state, node 86 becomes the high state and the output from the inverter 88 is low so that the output from the NOR gate 80 is high, which will turn on the controllable switch. When the controllable switch is on, the potential of the input-output pad 83 quickly drops to the low state. That is, R1 with a low resistance value of the controllable switch equivalently acts as a pulldown resistor. Consequently, the input signal from the input-output pad 83 proceeds to operate in the main circuitry area after the action of the inverter 68.

Hence, the input buffer according to the second preferred embodiment of the present invention requires that R2 is far larger than R1, for example, R2 is 10 to 100 times larger than R1, so that R2 has no effect in measuring the IDDQ current, no matter the input signal is in the low or high state. For example, if R1 has an equivalent resistance less than 100KΩ, the resistance value of R2 is then required to be larger than 1MΩ accordingly.

Furthermore, the tristate buffer can also be low-state enabled. That is, the tristate buffer turns on when the output enabler EN is low. It is well known by those who skilled in the art that some adjustments in the circuit are required if the low-state enabling scheme is adopted. It is therefore not necessary to have a high-state enabled tristate buffer in this preferred embodiment of the present invention.

As a summary, the input buffer and input-output buffer in full compliance with IDDQ testability have the following advantages:

1. The IDDQ testing results will not be affected no matter the circuit is operated in an output mode or input mode. Nor does the input signal, either in the low state or in the high state, have effect on the IDDQ testing results.

2. The problem of reduced operating speed is accordingly avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An input-output buffer in full compliance with IDDQ testability, comprising:

an input-output pad connected to a signal input;

a tristate buffer having an output enabler which determines an ON/OFF state of the tristate buffer, wherein an output of the tristate buffer is coupled to the input-output pad;

an inverter having an input, wherein the input of the inverter is coupled to the input-output pad;

a high-impedance resistor connected to the inverter in parallel;

an OR gate having an input connected to the output enabler of the tristate buffer and an input connected to an output of the inverter; and a resistor of a P-type controllable switch having a control input, coupled to the input-output pad and an internal voltage source, wherein the control input of the P-type controllable switch is coupled to an output of the OR gate, wherein the P-type controllable switch is on as an equivalent low-impedance resistor if the control input is in a low state, and the P-type controllable switch is off if the control input is in a high state.

2. The input-output buffer in full compliance with IDDQ testability of claim 1, wherein the resistance value of the high-impedance resistor is 10 to 100 times larger than that of the resistor of the P-type controllable switch.

3. An input-output buffer in full compliance with IDDQ testability, comprising:

an input-output pad connected to a signal input;

a tristate buffer having an output enabler which determines an ON/OFF state of the tristate buffer, wherein an output of the tristate buffer is coupled to the input-output pad;

an inverter having an input, wherein the input of the inverter is coupled to the input-output pad;

a high-impedance resistor connected to the inverter in parallel;

a NOR gate having an input connected to the output enabler of the tristate buffer and an input connected to an output of the inverter; and a resistor of a N-type controllable switch having a control input, coupled to the input-output pad and an internal voltage source, wherein the control input of the N-type controllable switch is coupled to an output of the NOR gate, wherein the N-type controllable switch is on as an equivalent low-impedance resistor if the control input is in a high state, and the N-type controllable switch is off if the control input is in a low state.

4. The input-output buffer in full compliance with IDDQ testability of claim 3, wherein the resistance value of the high-impedance resistor is 10 to 100 times larger than that of the resistor of the N-type controllable switch.

5. An input-output buffer in full compliance with IDDQ testability, comprising:

an input-output pad connected to a signal input;

a tristate buffer having an output enabler which determines an ON/OFF state of the tristate buffer, wherein an output of the tristate buffer is coupled to the input-output pad;

a first inverter having an input, wherein the input of the first inverter is coupled to the input-output pad;

a second inverter having an input, wherein the input of the second inverter is coupled to an output of the first inverter;

a high-impedance resistor connected to the first inverter in parallel;

an OR gate having an input connected to the output enabler of the tristate buffer and an input connected to an output of the second inverter; and a resistor of a P-type controllable switch having a control input, coupled to the input-output pad and a ground, wherein the control input of the P-type controllable switch is coupled to an output of the OR gate, wherein the P-type controllable switch is on as an equivalent low-impedance resistor if the control input is in a low state, and the P-type controllable switch is off if the control input is in a high state.

6. The input-output buffer in full compliance with IDDQ testability of claim 5, wherein the resistance value of the high-impedance resistor is 10 to 100 times larger than that of the resistor of the P-type controllable switch.

7. An input-output buffer in full compliance with IDDQ testability, comprising:

an input-output pad connected to a signal input;

a tristate buffer having an output enabler which determines an ON/OFF state of the tristate buffer, wherein an output of the tristate buffer is coupled to the input-output pad;

a first inverter having an input, wherein the input of the first inverter is coupled to the input-output pad;

a second inverter having an input, wherein the input of the second inverter is coupled to an output of the first inverter;

a high-impedance resistor connected to the first inverter in parallel;

a NOR gate having an input connected to the output enabler of the tristate buffer and an input connected to an output of the second inverter; and a resistor of a N-type controllable switch having a control input, coupled to the input-output pad and a ground, wherein the control input of the N-type controllable switch is coupled to an output of the NOR gate, wherein the N-type controllable switch is on as an equivalent low-impedance resistor if the control input is in a high state, and the N-type controllable switch is off if the control input is in a low state.

8. The input-output buffer in full compliance with IDDQ testability of claim 7, wherein the resistance value of the high-impedance resistor is 10 to 100 times larger than that of the resistor of the N-type controllable switch.

* * * * *